(12) United States Patent
Jackson et al.

(10) Patent No.: US 8,642,370 B2
(45) Date of Patent: Feb. 4, 2014

(54) CAVITY OPEN PROCESS TO IMPROVE UNDERCUT

(75) Inventors: Ricky Alan Jackson, Richardson, TX (US); Walter Baker Meinel, Tucson, AZ (US); Karen Hildegard Ralston Kirmse, Richardson, TX (US); Kandis Meinel, Tucson, legal representative, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/411,871

(22) Filed: Mar. 5, 2012

(65) Prior Publication Data

US 2012/0225559 A1 Sep. 6, 2012

Related U.S. Application Data

(60) Provisional application No. 61/449,270, filed on Mar. 4, 2011.

(51) Int. Cl.
*H01L 21/00* (2006.01)

(52) U.S. Cl.
USPC ............ 438/48; 438/50; 438/51; 438/52; 438/712; 438/738; 257/49; 257/414; 257/734; 257/E21.001; 257/E21.218

(58) Field of Classification Search
None
See application file for complete search history.

(56) References Cited

U.S. PATENT DOCUMENTS

| | | | | |
|---|---|---|---|---|
| 5,198,390 A * | 3/1993 | MacDonald et al. | ............ | 438/52 |
| 6,712,983 B2 * | 3/2004 | Zhao et al. | ............ | 216/2 |
| 7,074,635 B2 * | 7/2006 | Kim et al. | ............ | 438/50 |
| 7,166,488 B2 * | 1/2007 | MacDonald et al. | ............ | 438/52 |
| 7,554,504 B2 * | 6/2009 | Mohamadi | ............ | 343/776 |
| 7,932,118 B2 * | 4/2011 | Robert et al. | ............ | 438/53 |
| 7,981,715 B2 * | 7/2011 | Robert | ............ | 438/52 |
| 8,030,112 B2 * | 10/2011 | Hsieh et al. | ............ | 438/51 |
| 8,047,074 B2 * | 11/2011 | Jun et al. | ............ | 73/335.05 |
| 8,329,492 B2 * | 12/2012 | Wang et al. | ............ | 438/50 |

* cited by examiner

*Primary Examiner* — Zandra Smith
*Assistant Examiner* — Khanh Duong
(74) *Attorney, Agent, or Firm* — Jacqueline J. Garner; Wade J. Brady, III; Frederick J. Telecky, Jr.

(57) ABSTRACT

A process of forming a MEMS device with a device cavity underlapping an overlying dielectric layer stack having an etchable sublayer over an etch-resistant lower portion, including: etching through at least the etchable sublayer of the overlying dielectric layer stack in an access hole to expose a lateral face of the etchable sublayer, covering exposed surfaces of the etchable sublayer by protective material, and subsequently performing a cavity etch. A cavity etch mask may cover the exposed surfaces of the etchable sublayer. Alternatively, protective sidewalls may be formed by an etchback process to cover the exposed surfaces of the etchable sublayer. Alternatively, the exposed lateral face of the etchable sublayer may be recessed by an isotropic etch, than isolated by a reflow operation which causes edges of an access hole etch mask to drop and cover the exposed lateral face of the etchable sublayer.

19 Claims, 19 Drawing Sheets

US 8,642,370 B2

CAVITY OPEN PROCESS TO IMPROVE UNDERCUT

CROSS-REFERENCE TO RELATED APPLICATIONS

This application claims the benefit of priority under U.S.C. §119(e) of U.S. Provisional Application 61/449,270 (Texas Instruments, filed Mar. 4, 2011).

The following co-pending patent applications are related and hereby incorporated by reference:

U.S. patent application Ser. No. 13/411,861 (Texas Instruments, filed Mar. 5, 2012) entitled "CAVITY PROCESS ETCH UNDERCUT MONITOR,"

U.S. patent application 13/411,849 (Texas Instruments, filed Mar. 5, 2012) entitled "INFRARED SENSOR DESIGN USING AN EPDXY FILM AS AN INFRARED ABSORPTION LAYER,"

U.S. patent application 13/412,562 (Texas Instruments, filed Mar. 5, 2012) entitled "BACKGRIND PROCESS FOR INTEGRATED CIRCUIT WAFERS," and U.S. patent application 13/412,563 (Texas Instruments, filed Mar. 5, 2012) entitled "SENSOR COVER FOR INTEGRATED SENSOR CHIPS."

FIELD OF THE INVENTION

This invention relates to the field of microelectronic mechanical systems (MEMS) devices. More particularly, this invention relates to three-dimensional structures in MEMS devices.

BACKGROUND OF THE INVENTION

A micromechanical electronic system (MEMS) device may have a cavity in a substrate underlapping an overlying layer. The cavity may be formed using an isotropic etch process through an access hole in the overlying layer. During the cavity etch, an exposed sublayer of the overlying layer may be undesirably etched.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A MEMS device may have a device cavity underlapping an overlying dielectric layer stack. An etchable sublayer, which is susceptible to damage during a subsequent cavity etch, is disposed over an etch-resistant lower portion of the overlying dielectric layer stack. The MEMS device may be formed by etching through at least the etchable sublayer of the overlying dielectric layer stack in an access hole to expose a lateral face of the etchable sublayer. Exposed surfaces of the etchable sublayer are subsequently covered by protective material to isolate the sublayer during a subsequent cavity etch. In one embodiment, a cavity etch mask may cover the exposed surfaces of the etchable sublayer. In another embodiment, protective sidewalls may be formed by an etchback process to cover the exposed surfaces of the etchable sublayer. In a further embodiment, the exposed lateral face of the etchable sublayer may be recessed by an isotropic etch, than isolated by a reflow operation which causes edges of an access hole etch mask to drop and cover the exposed lateral face of the etchable sublayer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A MEMS device may have a device cavity underlapping an overlying dielectric layer stack. An etchable sublayer, which is susceptible to damage during a subsequent cavity etch, is disposed over an etch-resistant lower portion of the overlying dielectric layer stack. The MEMS device may be formed by etching through at least the etchable sublayer of the overlying dielectric layer stack in an access hole to expose a lateral face of the etchable sublayer. Exposed surfaces of the etchable sublayer are subsequently covered by protective material to isolate the sublayer during a subsequent cavity etch. In one embodiment, a cavity etch mask may cover the exposed surfaces of the etchable sublayer. In another embodiment, protective sidewalls may be formed by an etchback process to cover the exposed surfaces of the etchable sublayer. In a further embodiment, the exposed lateral face of the etchable sublayer may be recessed by an isotropic etch, than isolated by a reflow operation which causes edges of an access hole etch mask to drop and cover the exposed lateral face of the etchable sublayer.

Figure 1A:
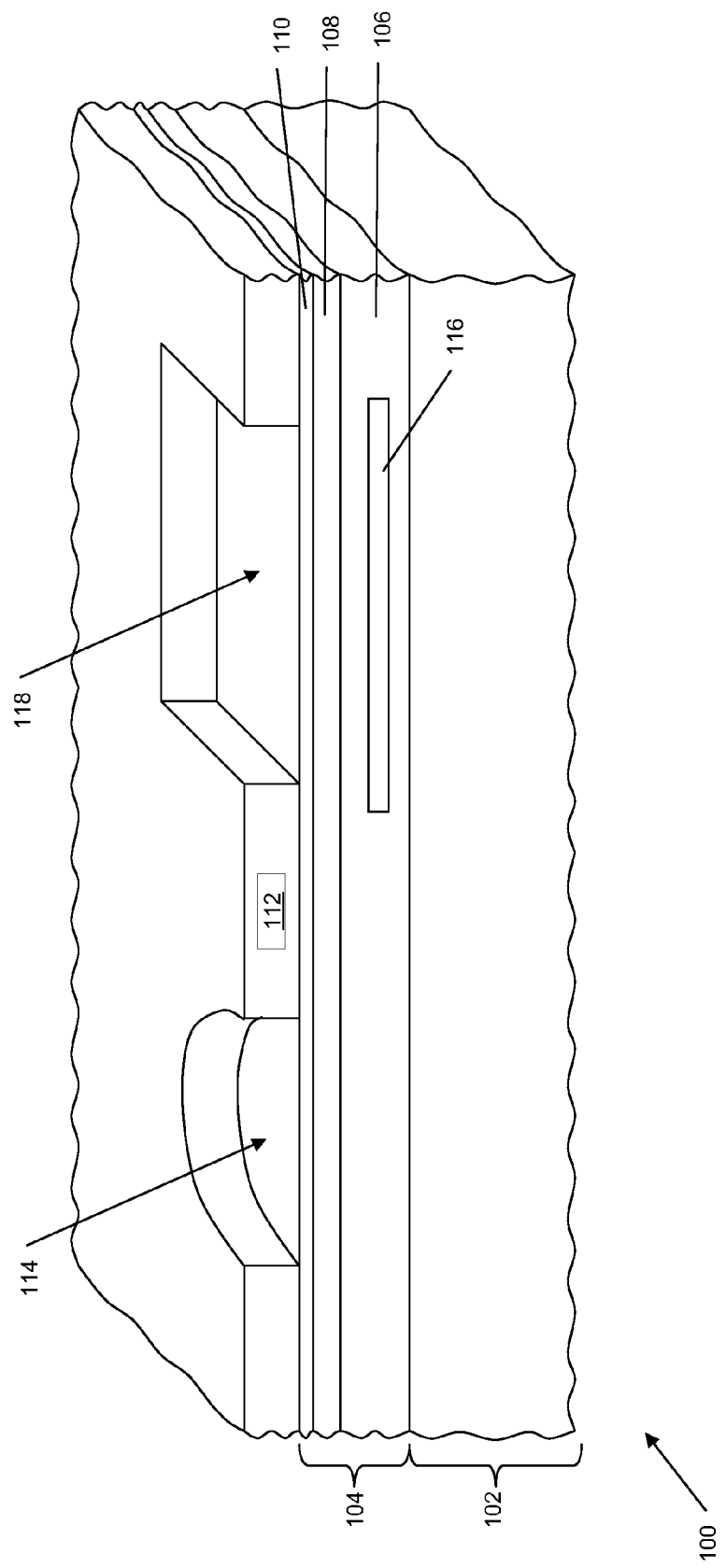
FIG. 1A through FIG. 1E are cross sections of a MEMS device formed according to an embodiment, depicted in successive stages of fabrication.

FIG. 1A through FIG. 1E are cross sections of a MEMS device formed according to an embodiment, depicted in successive stages of fabrication. Referring to FIG. 1A, the MEMS device 100 is formed in and on a substrate 102, which may be, for example, a silicon wafer. An overlying dielectric layer stack 104 is formed over the substrate 102. The overlying dielectric layer stack 104 includes an etch-resistant lower portion 106 which has a low etch rate during a subsequent cavity etch process. The cavity etch process is an isotropic etch process that forms a cavity in the substrate 102 through an access hole in the overlying dielectric layer stack 104. The etch-resistant lower portion 106 may include, for example, 3 to 10 microns of silicon dioxide formed by thermal oxidation of the substrate 102, decomposition of tetraethyl orthosilicate, also known as tetraethoxysilane or TEOS, and/or densification of methylsilsesquioxane (MSQ).

The overlying dielectric layer stack 104 further includes an etchable sublayer 108 formed over the etch-resistant lower portion 106. The etchable sublayer 108 has a high etch rate in the cavity etch process. The etchable sublayer 108 may provide a barrier to undesired contaminants. The etchable sublayer 108 may be, for example 500 nanometers to 2 microns of silicon nitride or silicon oxynitride formed by plasma-enhanced chemical vapor deposition (PECVD). The overlying dielectric layer stack 104 may possibly include an optional etch-resistant top sublayer 110 over the etchable sublayer 108, for example 200 to 800 nanometers of silicon dioxide formed by PECVD. The etch rate of the etchable sublayer 108 in the cavity etch process is at least three times the etch rate of the etch-resistant lower portion 106 in the cavity etch process. In one version of the instant embodiment, the etch rate of the etchable sublayer 108 may be at least five times the etch rate of the etch-resistant lower portion 106. In a further version, the etch rate of the etchable sublayer 108 may be at least ten times the etch rate of the etch-resistant lower portion 106.

An access hole etch mask 112 is formed over the overlying dielectric layer stack 104 which exposes the overlying dielectric layer stack 104 in an area for at least one access hole 114. A diameter of said access hole may be, for example, 10 to 25 microns. The access hole etch mask 112 may include, for example, photoresist formed by a photolithographic process. The overlying dielectric layer stack 104 may optionally include an input/output (I/O) pad 116 under the etchable sublayer 108. The I/O pad 116 may include, for example, a layer of aluminum alloy. The access hole etch mask 112 may include an area for an I/O opening 118 over the I/O pad 116.

Figure 1B:
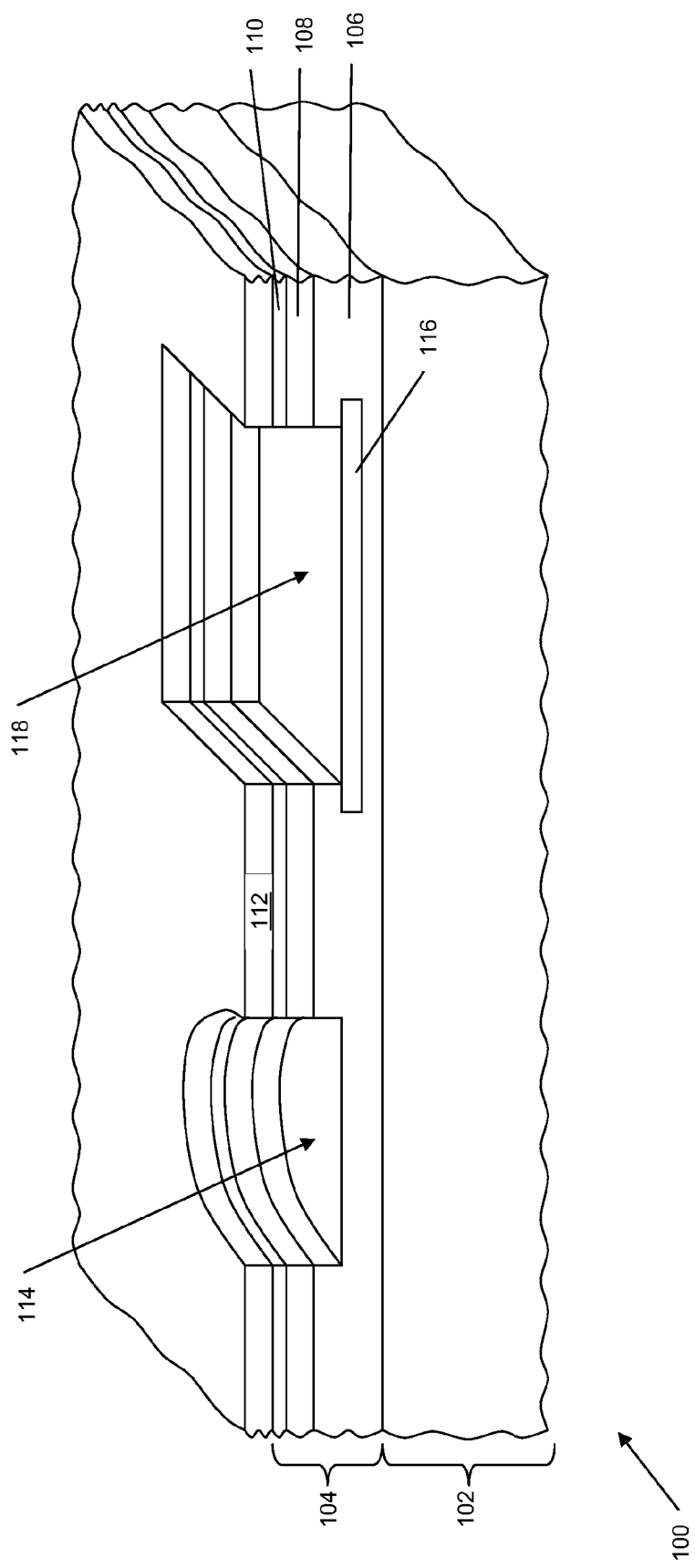
Figure 1C:
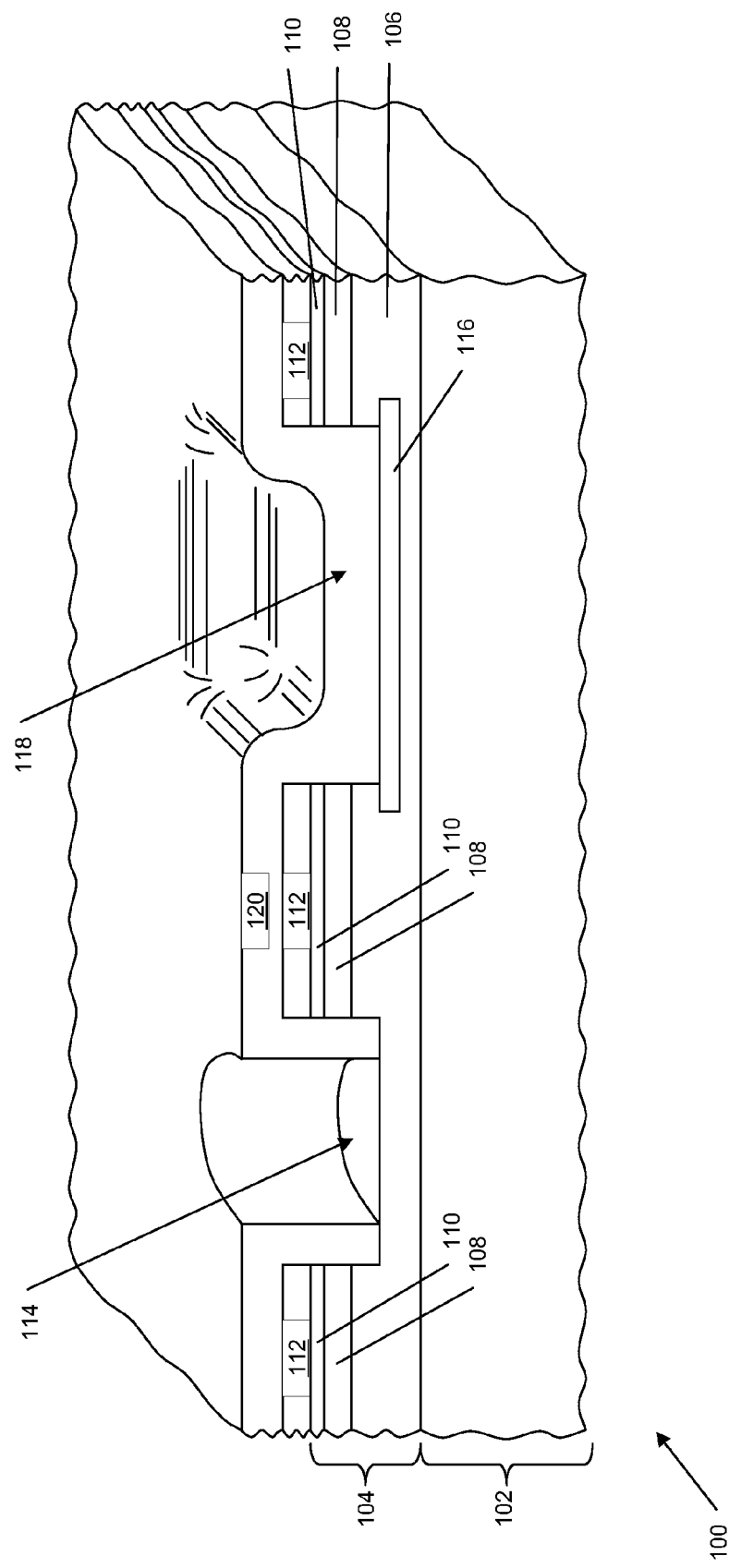
Figure 1D:
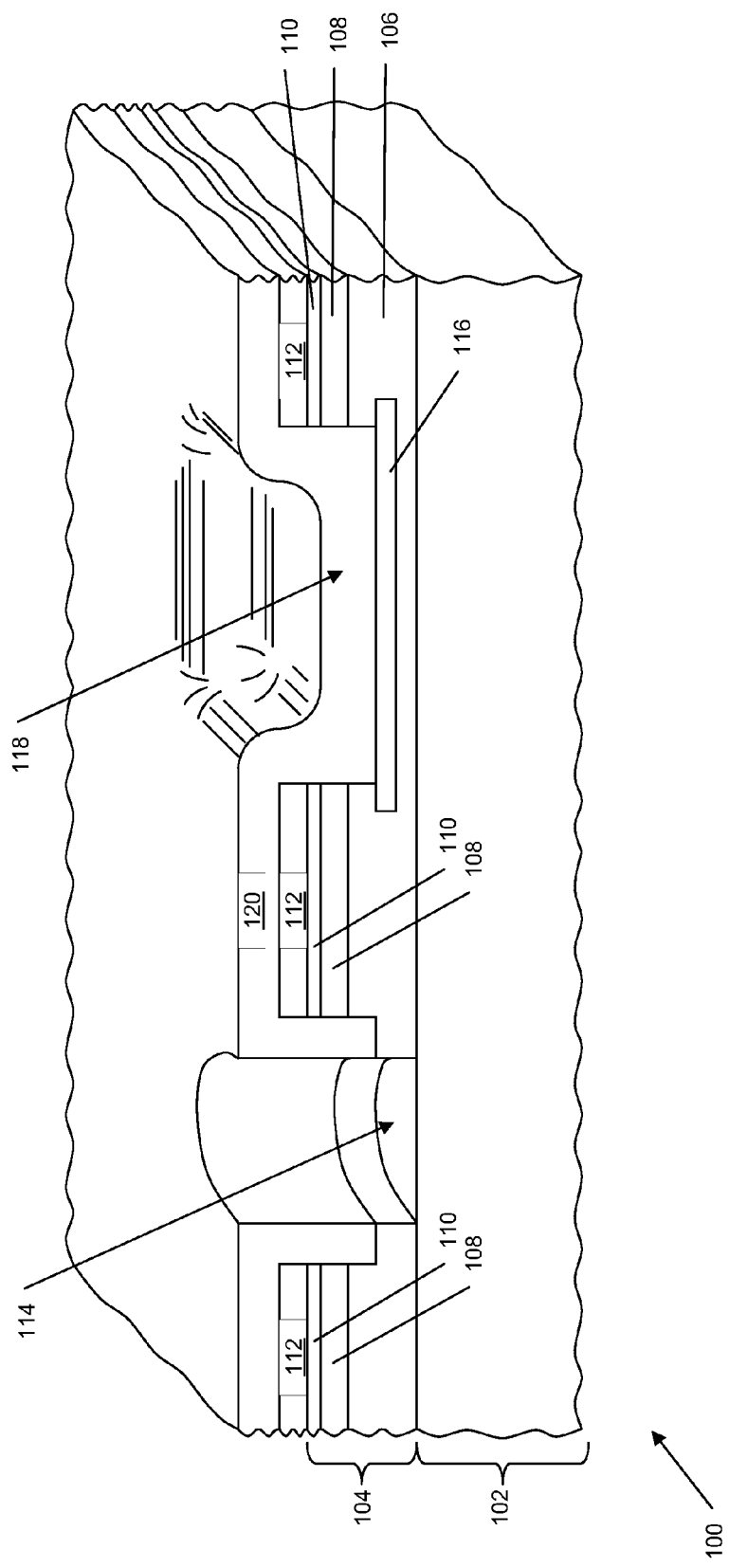
Figure 2:
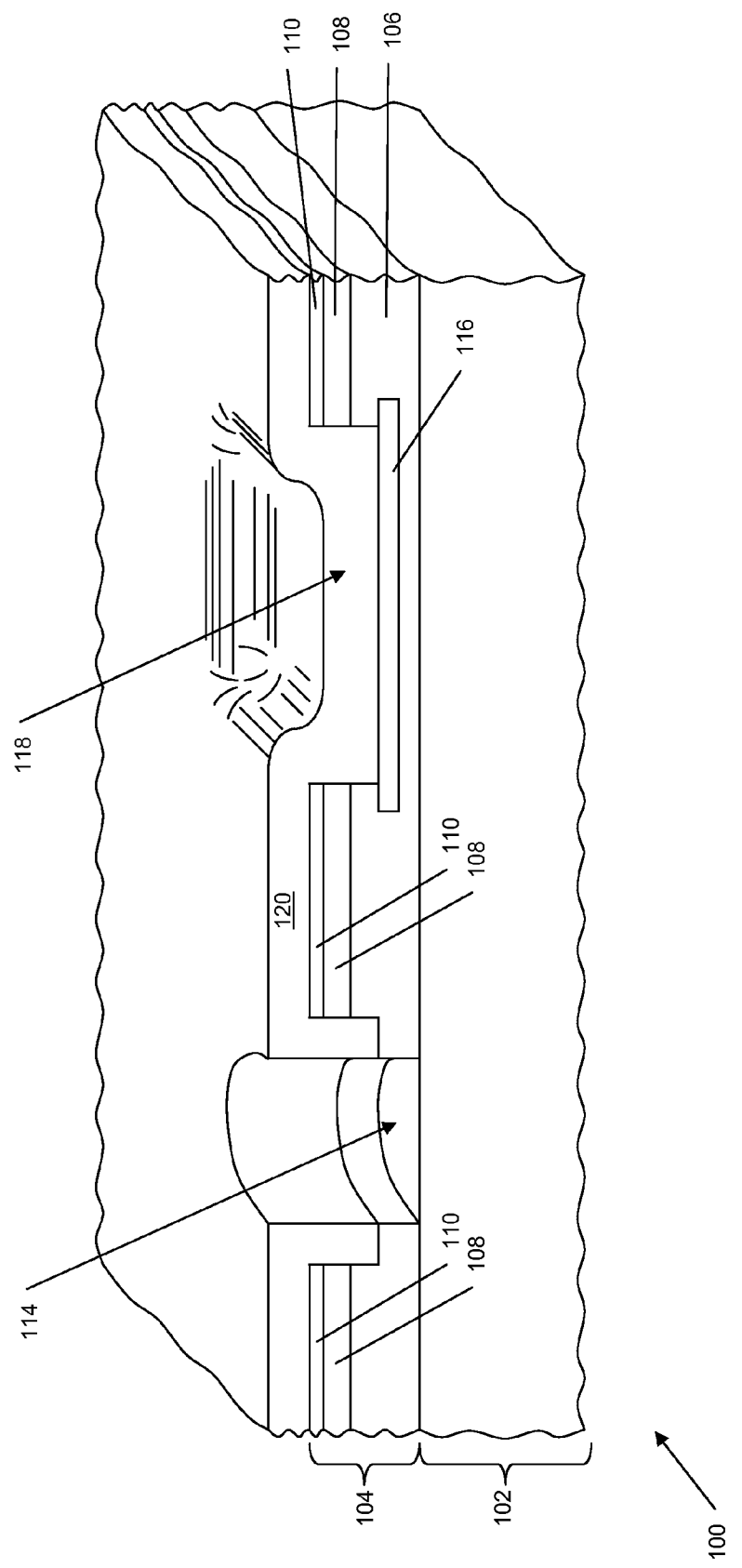
FIG. 2 depicts an alternate version of etching the access hole.
Figure 3A:
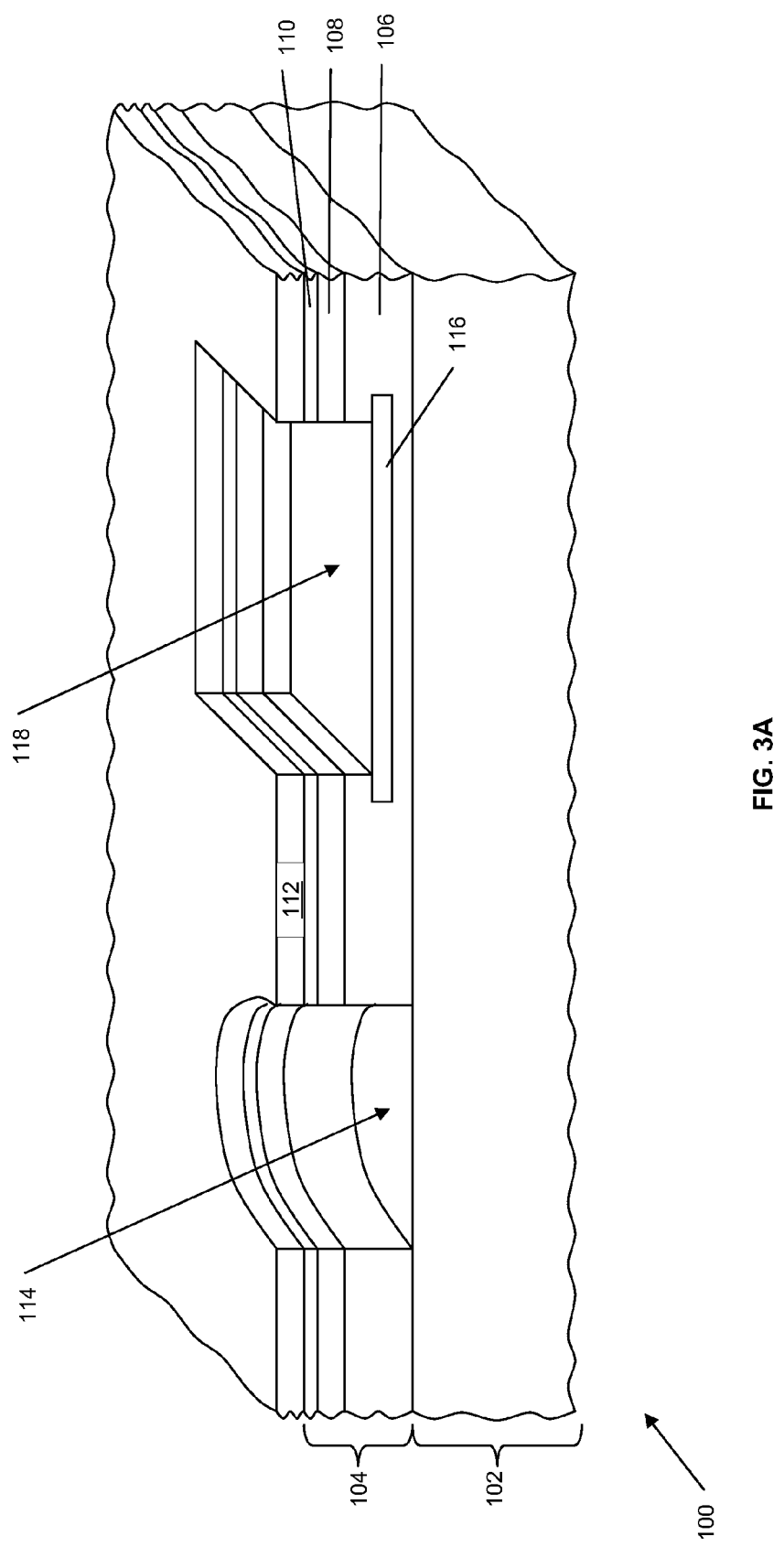
FIG. 3A and FIG. 3B depict a further version of etching the access hole.
Figure 3B:
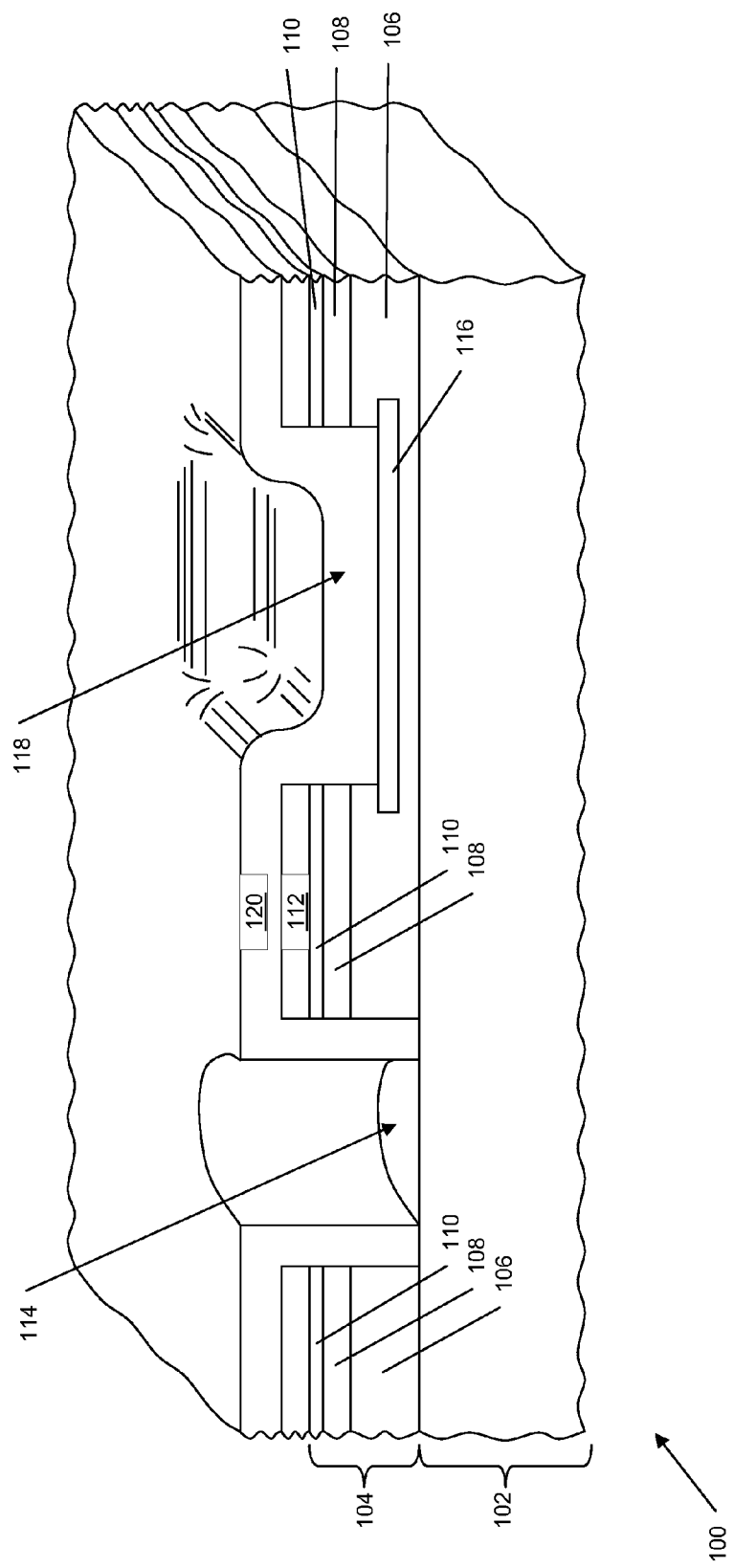
Figure 4:
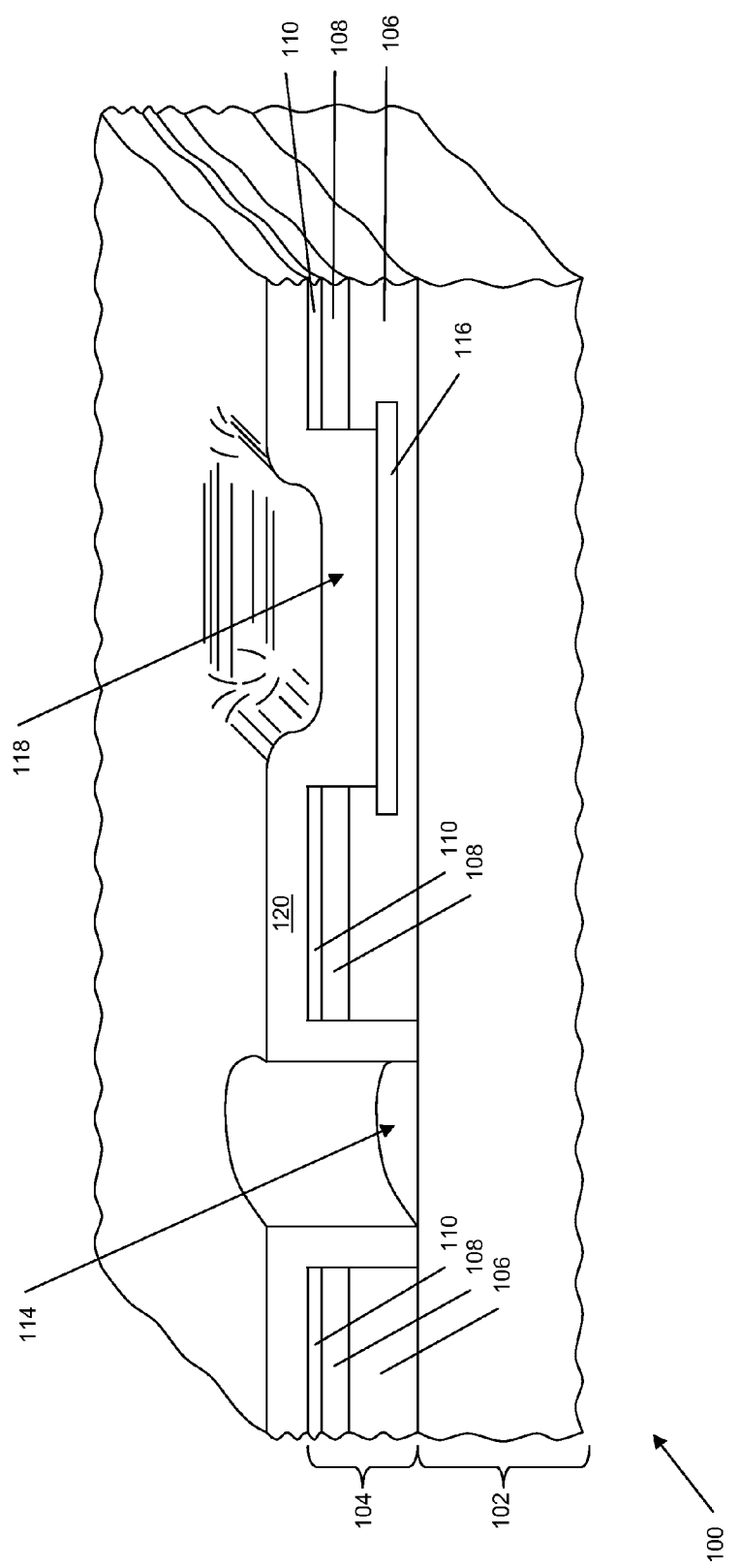
FIG. 4 depicts yet another version of etching the access hole.

FIG. 1B through FIG. 1D depict a version of the instant embodiment with regard to etching the access hole 114 in the overlying dielectric layer stack 104. FIG. 2 depicts an alternate version. FIG. 3A and FIG. 3B depict a further version, and FIG. 4 depicts yet another version.

Referring to FIG. 1B, a first step of an access hole etch process is performed which removes material from the overlying dielectric layer stack 104 in the area for the access hole 114 through the etchable sublayer 108, but not down to the substrate 102. If the area for the I/O opening 118 is present, the first step of the access hole etch process removes material from the overlying dielectric layer stack 104 in the area for the I/O opening 118, perhaps down to the I/O pad 116. The first step of the access hole etch process may include, for example, a reactive ion etch (RIE) process which uses fluorine and oxygen ions. A portion of the access hole etch mask 112 may be removed by the first step of the access hole etch process.

Referring to FIG. 1C, a cavity etch mask 120 is formed over the remaining access hole etch mask 112 after completion of the first step of the access hole etch process. The cavity etch mask 120 may include, for example, photoresist and be formed by a photolithographic operation. The cavity etch mask 120 covers exposed surfaces of the etchable sublayer 108 and exposes a bottom surface of the access hole 114. The cavity etch mask 120 may, for example, cover the exposed surfaces of the etchable sublayer 108 with at least a micron of photoresist. The cavity etch mask 120 covers the I/O pad 116 if exposed by the first step of the access hole etch process.

Referring to FIG. 1D, a second step of the access hole etch is performed which removes material from the overlying dielectric layer stack 104 in the access hole down to the substrate 102. The second step of the access hole etch process may use similar reactants and process parameters as the first step of the access hole etch process. The cavity etch mask 120 and the remaining access hole etch mask 112 are left in place for the subsequent cavity etch process, discussed in reference to FIG. 1E.

FIG. 2 depicts an alternate version of etching the access hole 114. The remaining access hole etch mask 112 is removed after the first step of the access hole etch process is completed and before the cavity etch mask 120 is formed. The cavity etch mask 120 covers exposed surfaces of the etchable sublayer 108 and exposes the bottom surface of the access hole 114 as described in reference to FIG. 1C. The second step of the access hole etch is performed which removes material from the overlying dielectric layer stack 104 in the access hole down to the substrate 102. The cavity etch mask 120 is left in place for the subsequent cavity etch process, discussed in reference to FIG. 1E.

FIG. 3A and FIG. 3B depict a further version of etching the access hole 114. Referring to FIG. 3A, the access hole etch process is performed in one step which removes material from the overlying dielectric layer stack 104 in the area for the access hole 114 through the etchable sublayer 108 and down to the substrate 102. If the area for the I/O opening 118 is present, the access hole etch process removes material from the overlying dielectric layer stack 104 in the area for the I/O opening 118 down to the I/O pad 116. A portion of the access hole etch mask 112 may be removed by the access hole etch process.

Referring to FIG. 3B, the cavity etch mask 120 is formed over the remaining access hole etch mask 112 after completion of the access hole etch process. The cavity etch mask 120 covers exposed surfaces of the etchable sublayer 108 and exposes the substrate 102 at the bottom surface of the access hole 114. The cavity etch mask 120 covers the I/O pad 116 if exposed by the access hole etch process. The fabrication process resumes with the subsequent cavity etch process, discussed in reference to FIG. 1E.

FIG. 4 depicts yet another version of etching the access hole 114. The remaining access hole etch mask 112 is removed after the access hole etch process is completed and before the cavity etch mask 120 is formed. The cavity etch mask 120 covers exposed surfaces of the etchable sublayer 108 and exposes the substrate 102 at the bottom surface of the access hole 114 as described in reference to FIG. 3B. The fabrication process resumes with the subsequent cavity etch process, discussed in reference to FIG. 1E.

Figure 1E:
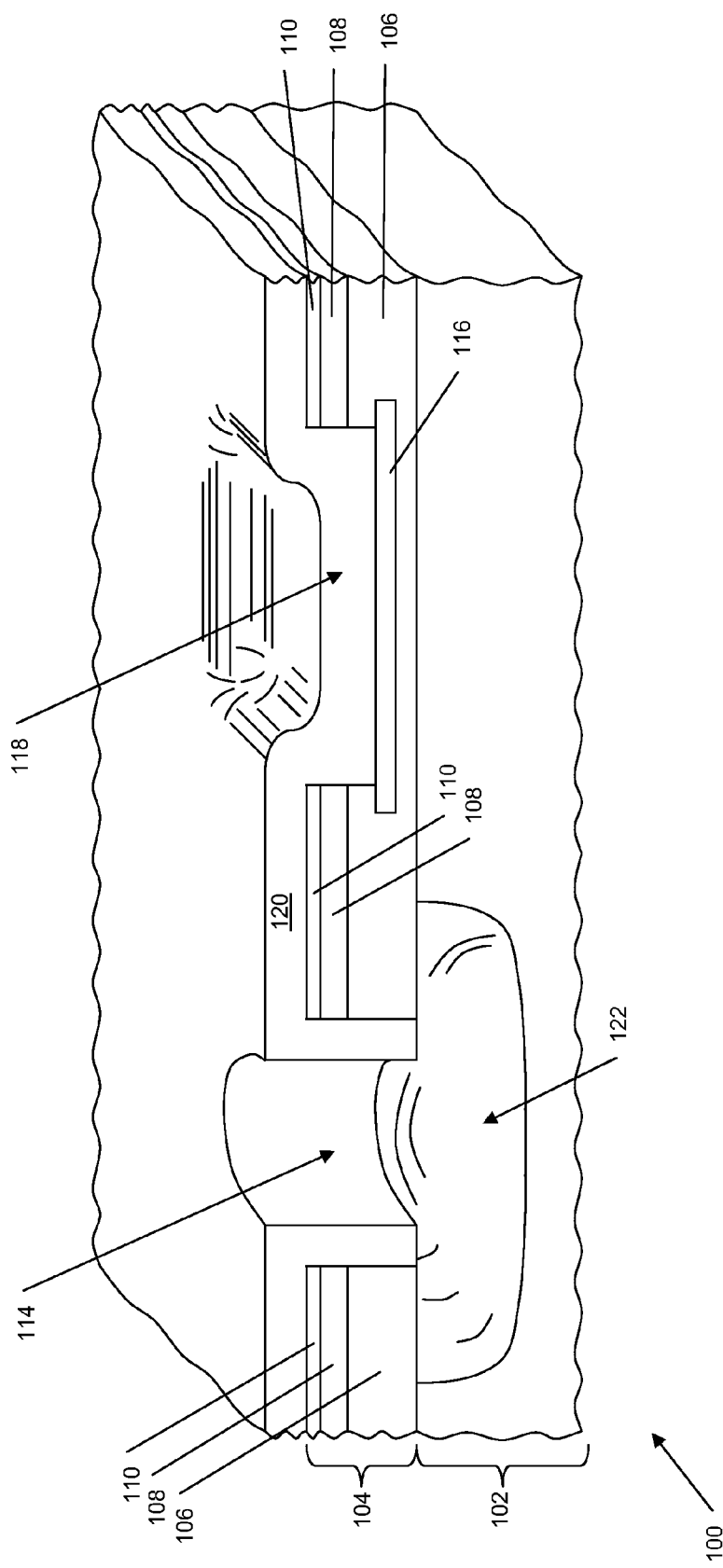

Referring to FIG. 1E, the cavity etch process is performed which is an isotropic gas-phase etch which removes material from the substrate 102 through the access hole 114 to form the cavity 122. The cavity etch process may be, for example, a downstream etch process using fluorine radicals. The cavity 122 underlaps the overlying dielectric layer stack 104 by at least 5 microns. During the cavity etch process, the etchable sublayer 108 is advantageously protected by the cavity etch mask 120 so that substantially no material is removed from the etchable sublayer 108. The cavity etch process may possibly remove negligible amounts of material from the etch-resistant lower portion 106 of the overlying dielectric layer stack 104. Alternately, the cavity etch process may possibly remove significant, but acceptable, amounts of material from the etch-resistant lower portion 106. The cavity etch process as discussed in reference to FIG. 1E may be performed subsequently to any of the fabrication process versions discussed in reference to FIG. 1B through FIG. 1D, FIG. 2, FIG. 3A and FIG. 3B, or FIG. 4. After the cavity etch process is completed, the cavity etch mask 120 and any remaining access hole etch mask 112 may be removed, for example by exposing the MEMS device 100 to an ambient containing oxygen radicals and/or ozone.

Figure 5A:
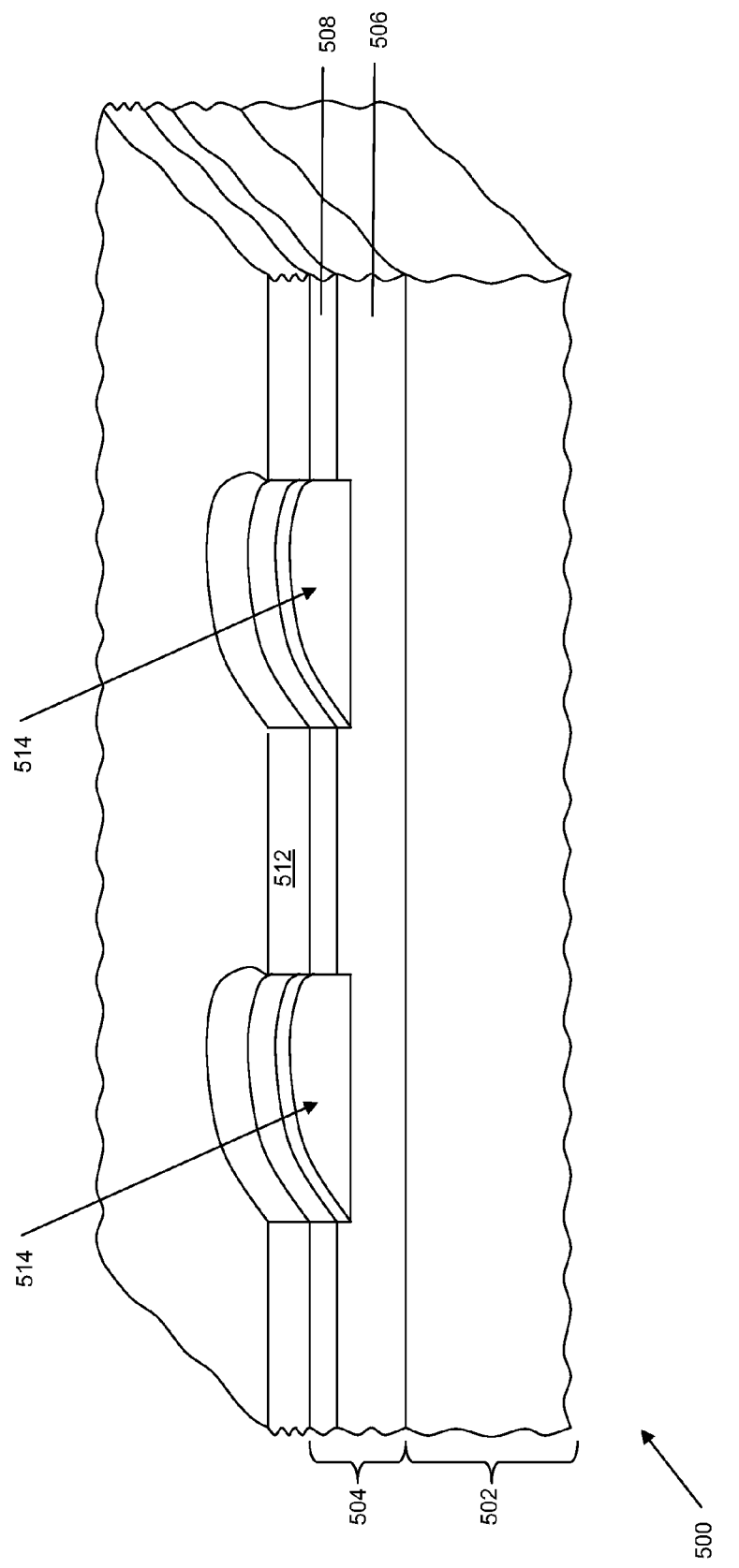
FIG. 5A through FIG. 5E are cross sections of a MEMS device formed according to another embodiment, depicted in successive stages of fabrication.

FIG. 5A through FIG. 5E are cross sections of a MEMS device formed according to another embodiment, depicted in successive stages of fabrication. Referring to FIG. 5A, the MEMS device 500 is formed in and on a substrate 502 as described in reference to FIG. 1A. An overlying dielectric layer stack 504 is formed over the substrate 502. The overlying dielectric layer stack 504 includes an etch-resistant lower portion 506 which has a low etch rate during a subsequent cavity etch process, as described in reference to FIG. 1A and FIG. 1E. The overlying dielectric layer stack 504 further includes an etchable sublayer 508 formed over the etch-resistant lower portion 506 which has a high etch rate in the cavity etch process, as described in reference to FIG. 1A. The overlying dielectric layer stack 504 may possibly include an optional etch-resistant top sublayer over the etchable sublayer 508, as described in reference to FIG. 1A.

An access hole etch mask 512 is formed over the overlying dielectric layer stack 504 which exposes the overlying dielectric layer stack 504 in one or more areas for access holes 514, as described in reference to FIG. 1A. A first step of an access hole etch process is performed which removes material from the overlying dielectric layer stack 504 in the areas for the access holes 514 at least through the etchable sublayer 508, possibly not down to the substrate 502, to form a first portion of the access holes 514.

Figure 5B:
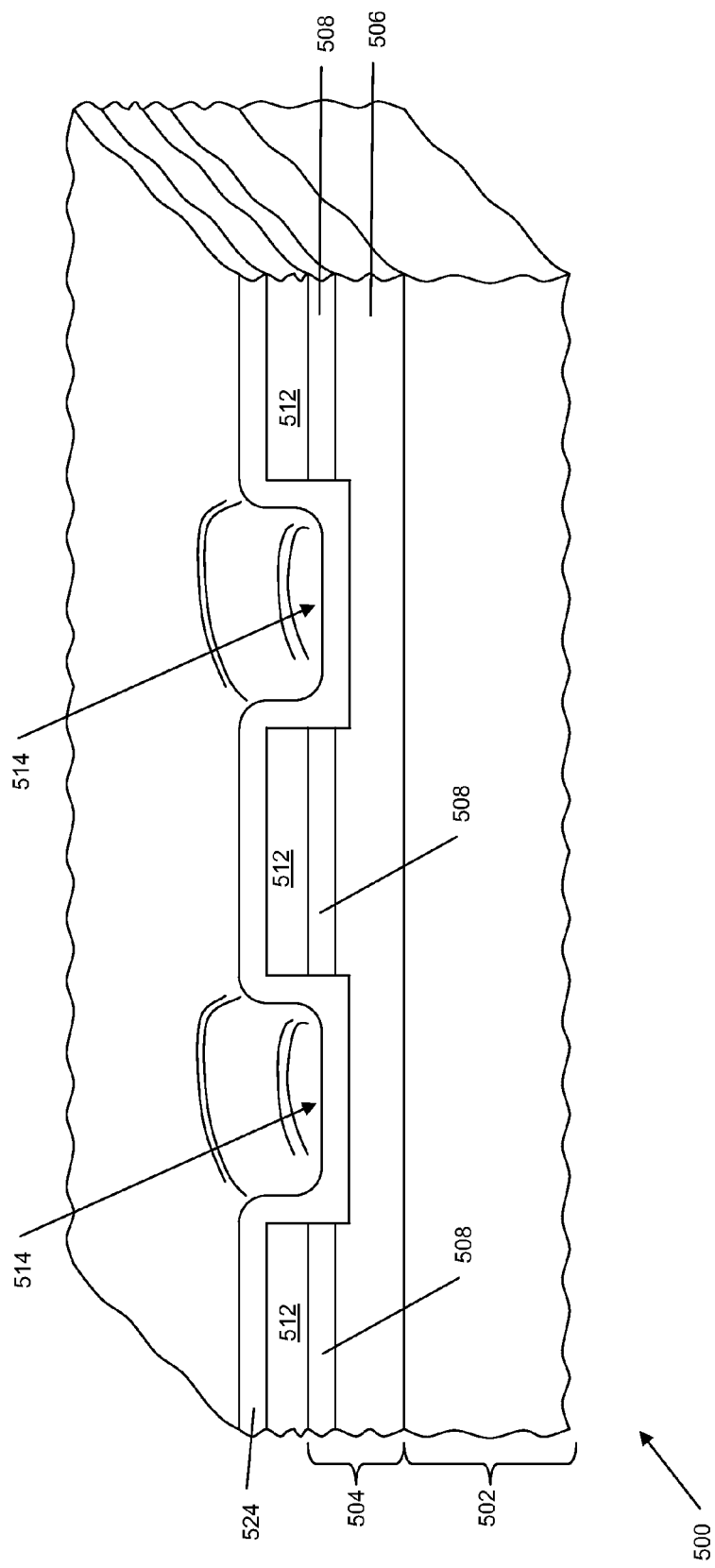

Referring to FIG. 5B, a conformal protective layer 524 is formed over the access hole etch mask 512 and in the access holes 514, covering exposed surfaces of the etchable sublayer 508. The conformal protective layer 524 may be, in one example, 100 nanometers to 1.5 microns of chemical vapor deposited polyp-xylylene) polymer, such as Parylene C. In another example, the conformal protective layer 524 may be a spin-on polyisoprene resin dispersed in a solvent such as xylene. The solvent may be removed after the resin is spin applied to the MEMS device 500, leaving a conformal coat of resin to form the conformal protective layer 524. A thickness of the conformal protective layer 524 at a bottom of the access holes 514 is significantly less than a depth of the access holes 514, for example half the depth or less.

Figure 5C:
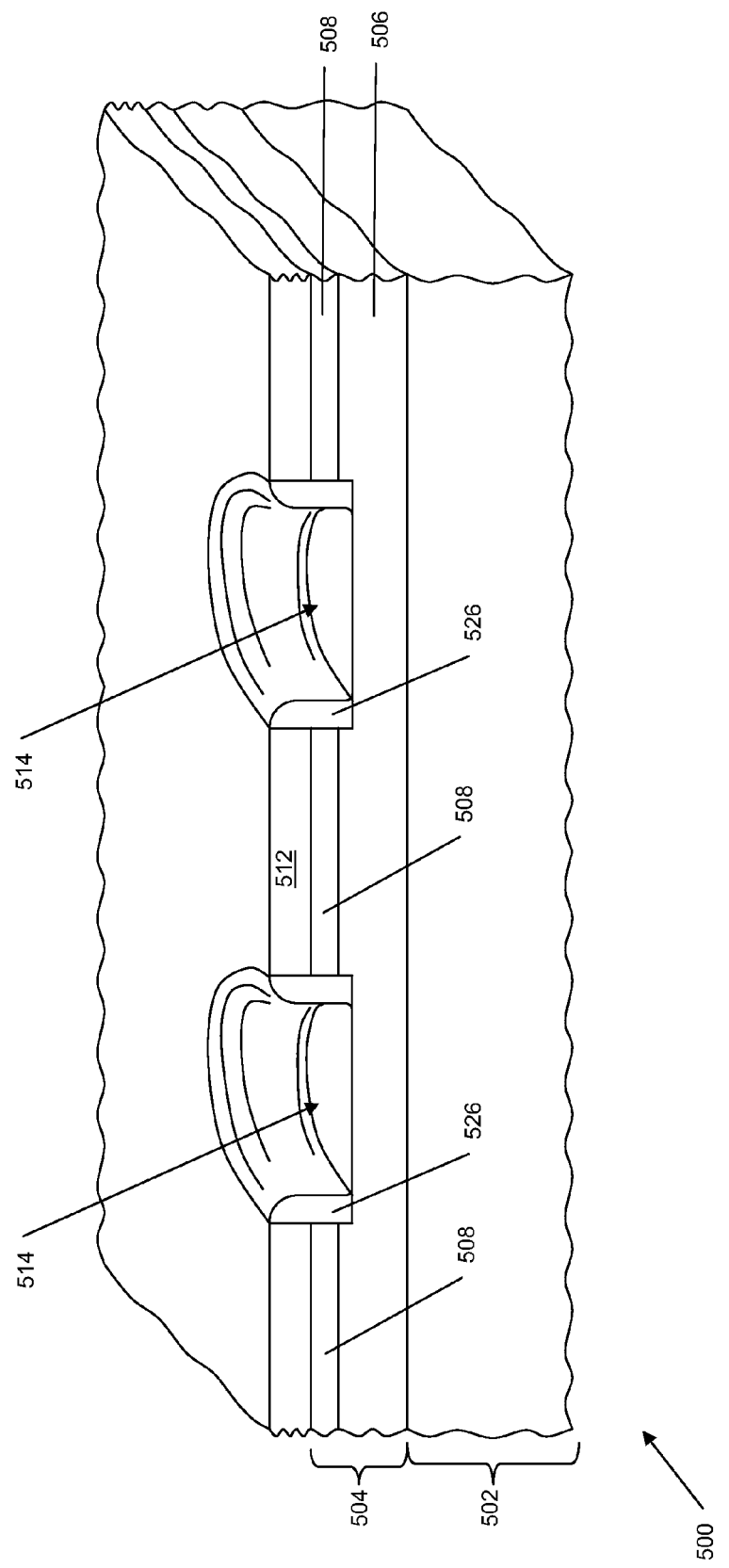

Referring to FIG. 5C, an anisotropic etchback process is performed which removes material from the conformal protective layer 524 at the bottom of the access holes 514 and leaves material of the conformal protective layer 524 on sidewalls of the access holes 514, so as to form protective sidewalls 526 covering exposed surfaces of the etchable sublayer 508. The anisotropic etchback process may include an RIE step using oxygen ions. A lateral thickness of the protective sidewalls 526 may be, for example, 50 nanometers to 1 micron.

Figure 5D:
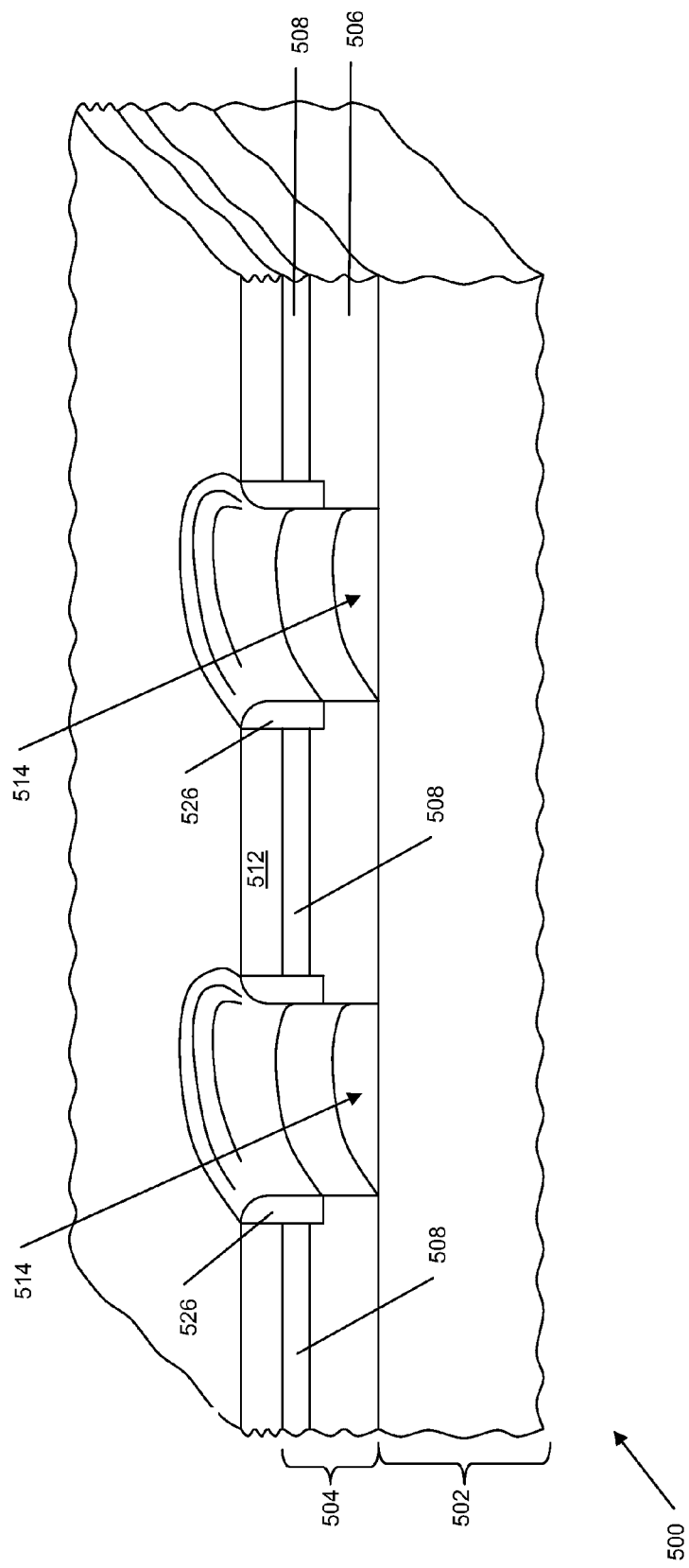

Referring to FIG. 5D, a second step of the access hole etch process is performed, if necessary, to remove any material from the overlying dielectric layer stack 504 at the bottom of the access holes 514, down to the substrate 502. The second step of the access hole etch process use similar reactants and process parameters as the first step of the access hole etch process. The second step of the access hole etch process may possibly remove some material from the protective sidewalls 526; however sufficient lateral thickness of the protective sidewalls 526 remains to protect the etchable sublayer 508 during a subsequent cavity etch process. Substantially no material is removed from the etchable sublayer 508 during the second step of the access hole etch process.

Figure 5E:
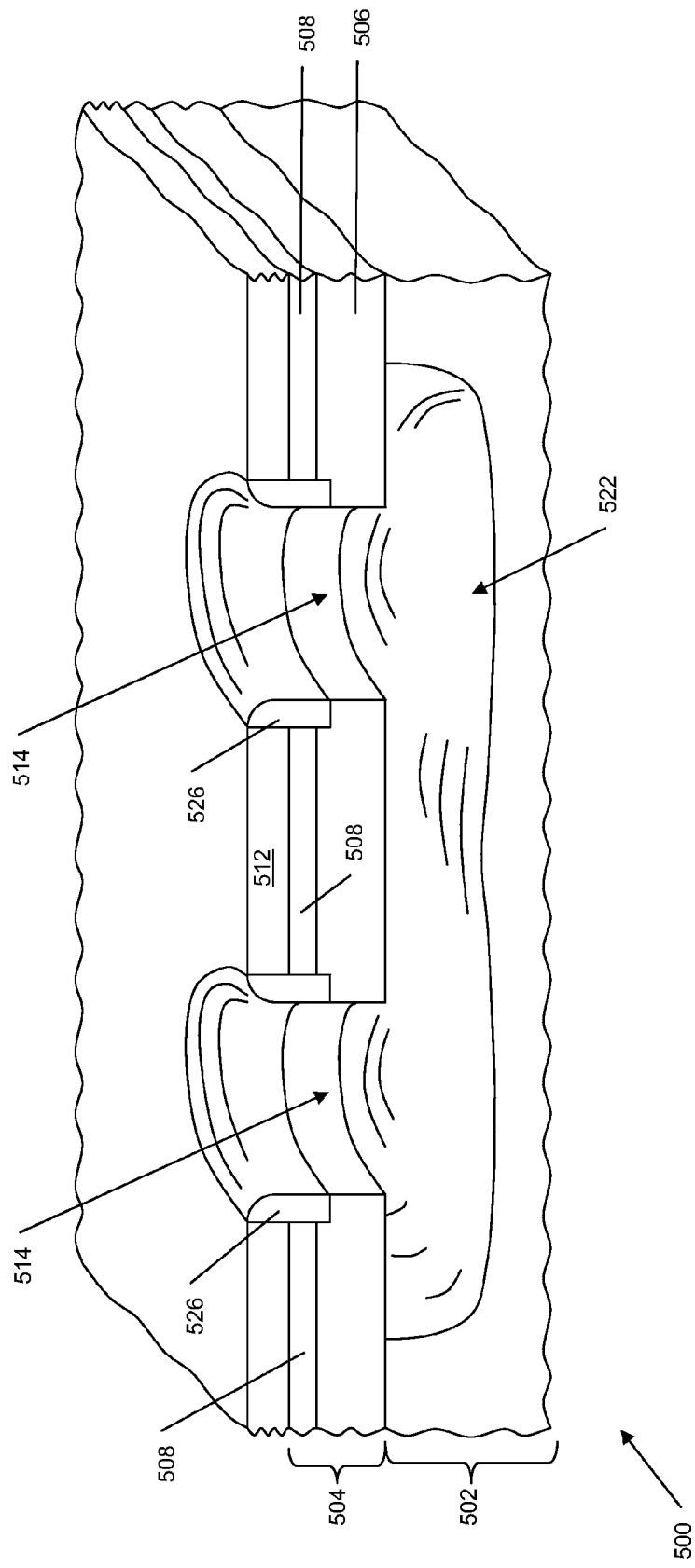

Referring to FIG. 5E, the cavity etch process is performed as described in reference to FIG. 1E, so as to remove material from the substrate 502 through the access holes 514 to form a cavity 522 in the substrate 502. The cavity 522 underlaps the overlying dielectric layer stack 504 by at least 5 microns. During the cavity etch process, the protective sidewalls 526 prevent significant loss of material from the etchable sublayer 508. After the cavity etch process is completed, the access hole etch mask 512 and the protective sidewalls 526 are removed.

Figure 6A:
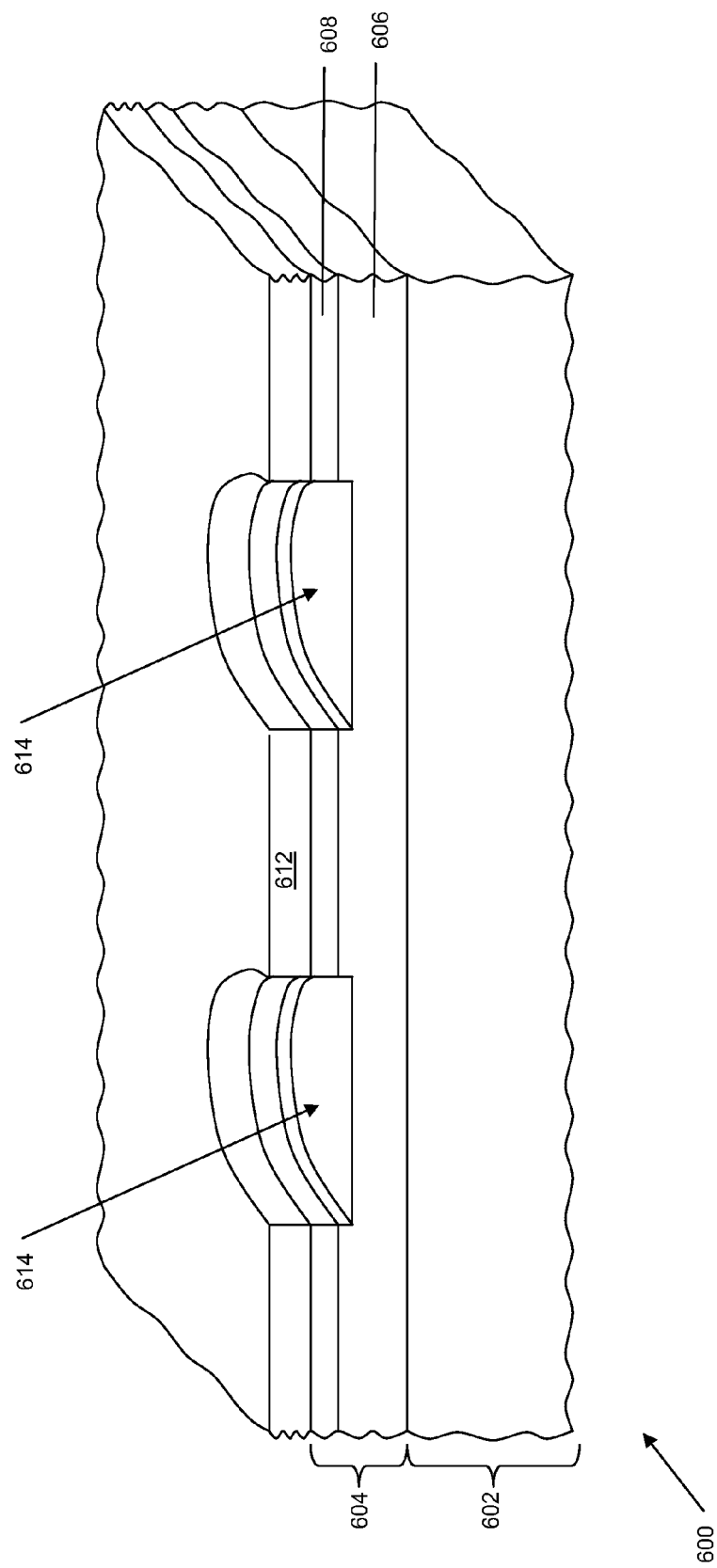
FIG. 6A through FIG. 6E are cross sections of a MEMS device formed according to a further embodiment, depicted in successive stages of fabrication.

FIG. 6A through FIG. 6E are cross sections of a MEMS device formed according to a further embodiment, depicted in successive stages of fabrication. Referring to FIG. 6A, the MEMS device 600 is formed in and on a substrate 602 as described in reference to FIG. 1A. An overlying dielectric layer stack 604 is formed over the substrate 602. The overlying dielectric layer stack 604 includes an etch-resistant lower portion 606 which has a low etch rate during a subsequent cavity etch process, as described in reference to FIG. 1A and FIG. 1E. The overlying dielectric layer stack 604 further includes an etchable sublayer 608 at a top surface of the overlying dielectric layer stack 604, formed over the etch-resistant lower portion 606, which has a high etch rate in the cavity etch process, as described in reference to FIG. 1A.

An access hole etch mask 612 is formed over the overlying dielectric layer stack 604 which exposes the overlying dielectric layer stack 604 in one or more areas for access holes 614, as described in reference to FIG. 1A. A first step of an access hole etch process is performed which removes material from the overlying dielectric layer stack 604 in the areas for the access holes 614 through the etchable sublayer 608, and a small depth into the etch-resistant lower portion 606, for example less than a thickness of the etchable sublayer 608. The first step of the access hole etch process may be performed, for example, as described in reference to FIG. 1B.

Figure 6B:
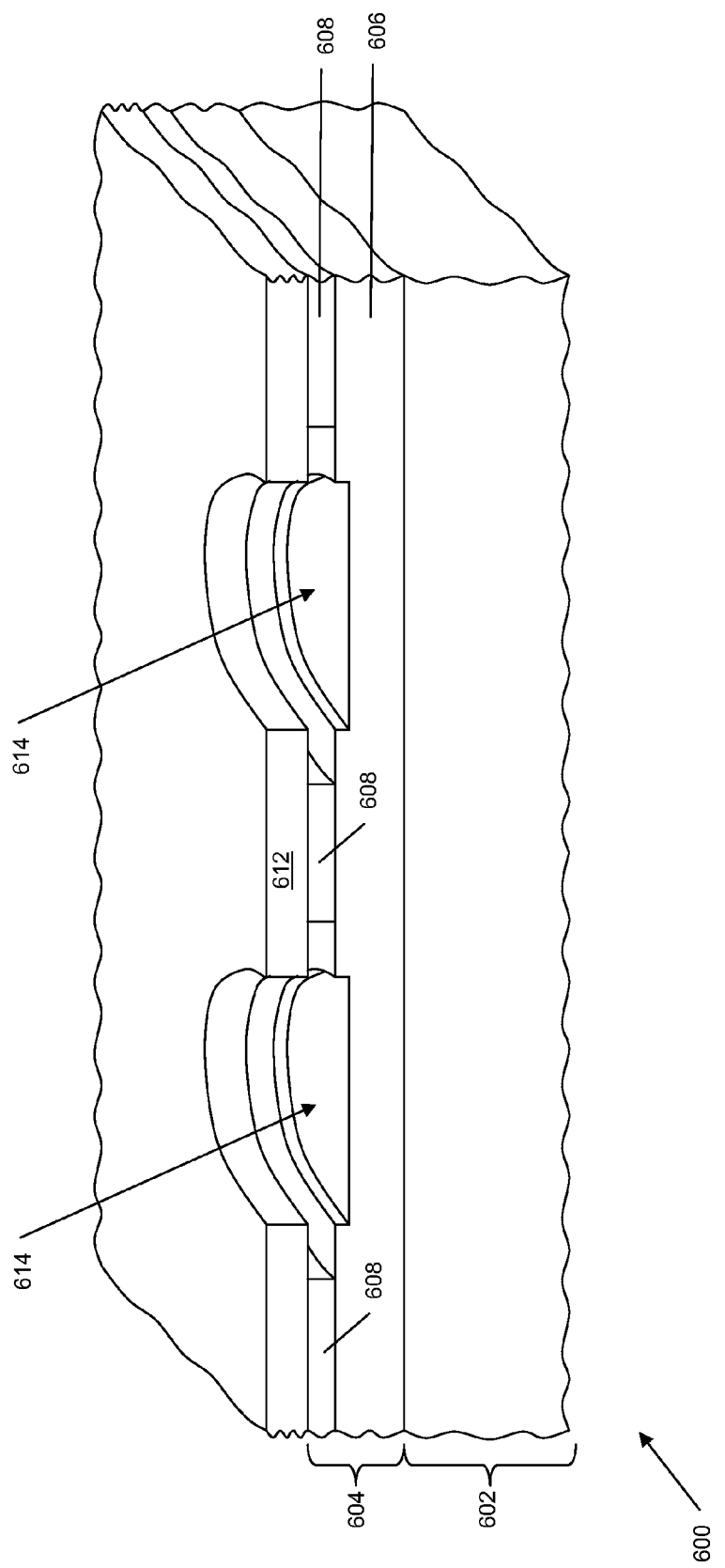

Referring to FIG. 6B, an isotropic etchback of the etchable sublayer 608 is performed which removes material from the etchable sublayer 608 so as to recess a lateral face of the etchable sublayer 608 in the access holes 614 back under the access hole etch mask 612 at least one and one-half times the thickness of the etchable sublayer 608. The isotropic etchback may be performed, for example, using a downstream etcher with fluorine radicals.

Figure 6C:
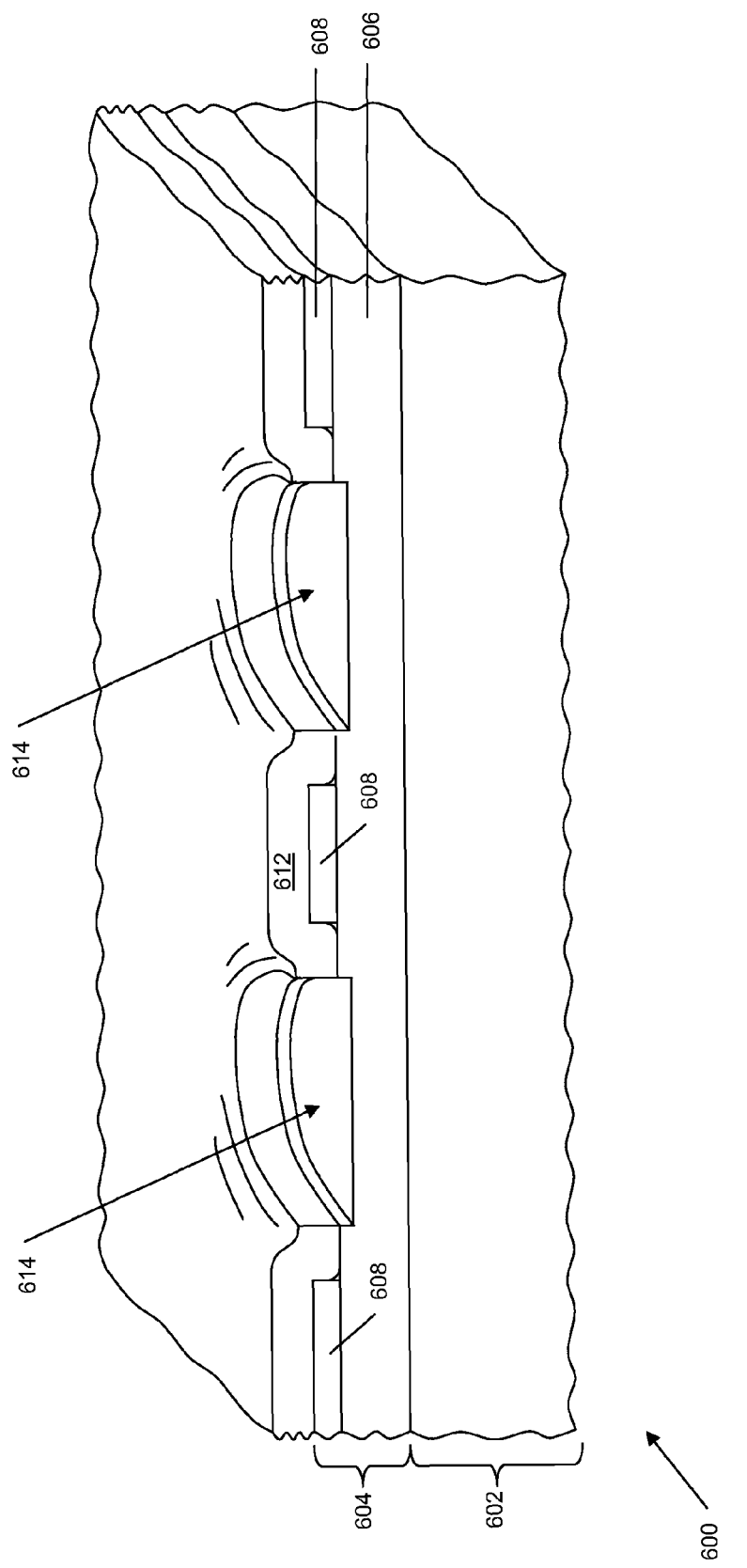

Referring to FIG. 6C, a reflow operation is performed on the access hole etch mask 612 which causes edges of the access hole etch mask 612 overhanging the etchable sublayer 608 to drop down to a top surface of the etch-resistant lower portion 606 and so to isolate the lateral face of the etchable sublayer 608 in the access holes 614. The reflow operation may include, for example, heating the MEMS device above 100° C. so as to soften the access hole etch mask 612.

Figure 6D:
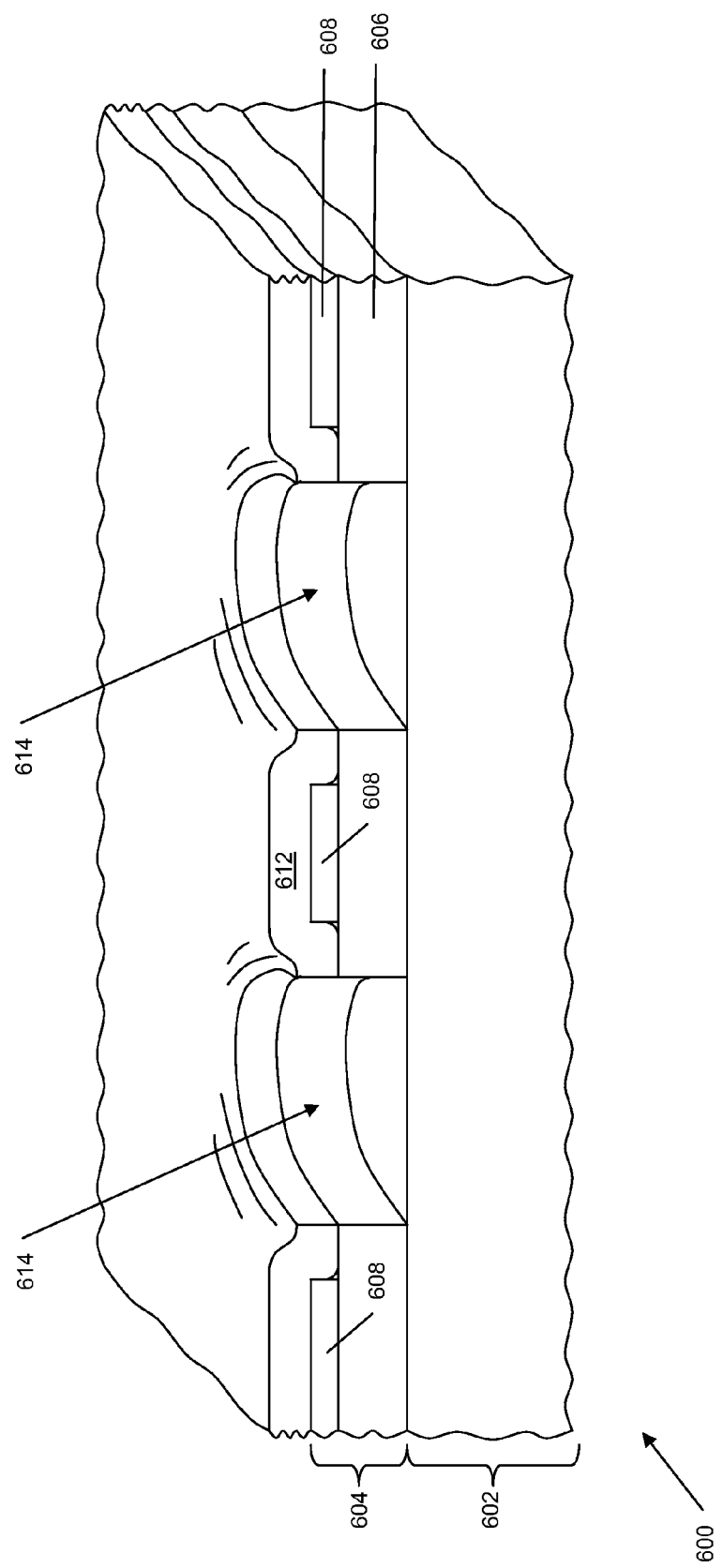

Referring to FIG. 6D, a second step of the access hole etch process is performed which removes material from the overlying dielectric layer stack 604 in the access hole down to the substrate 602. The second step of the access hole etch process may use similar reactants and process parameters as the first step of the access hole etch process. The access hole etch mask 612 is left in place for a subsequent cavity etch process.

Figure 6E:
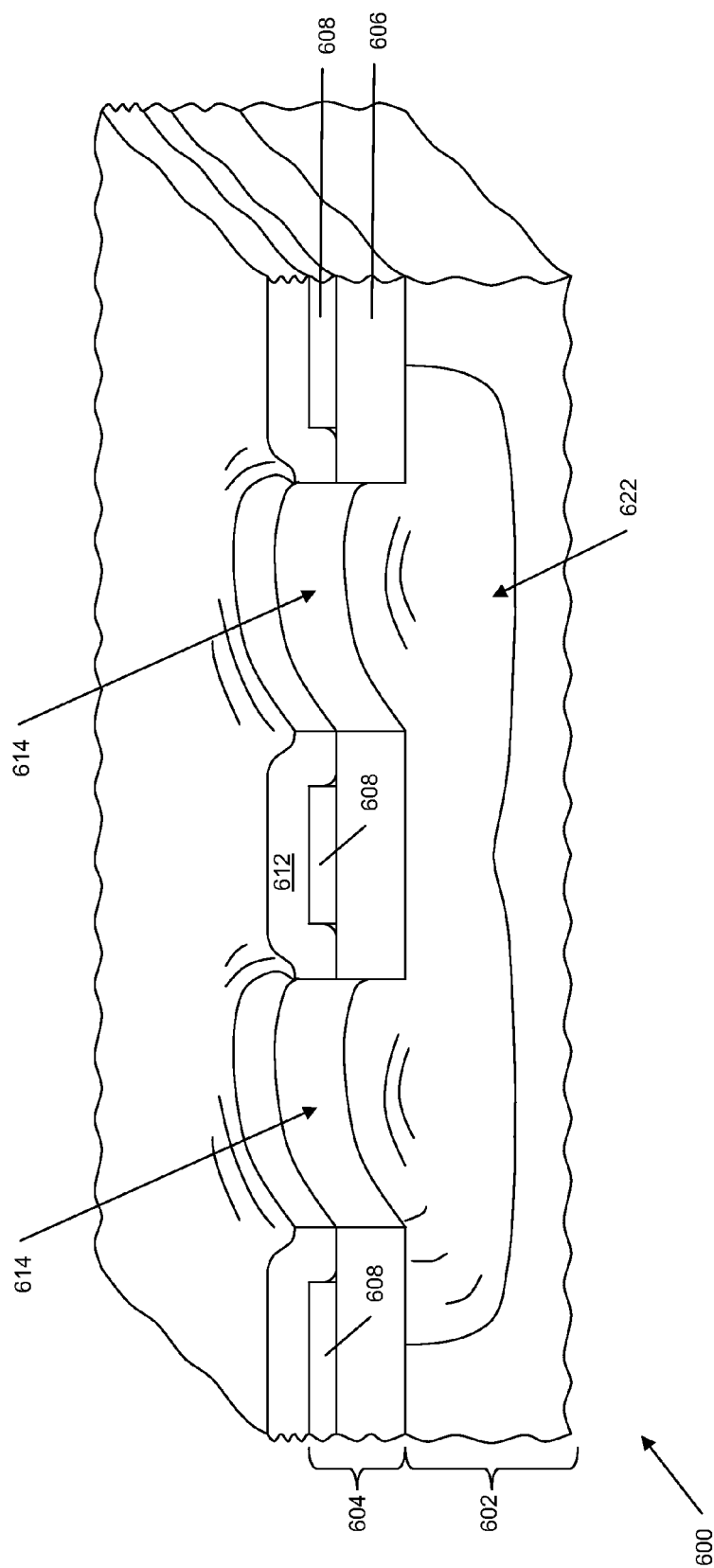

Referring to FIG. 6E, a cavity etch process is performed as described in reference to FIG. 1E, so as to remove material from the substrate 602 through the access holes 614 to form a cavity 622 in the substrate 602. The cavity 622 underlaps the overlying dielectric layer stack 604 by at least 5 microns.

During the cavity etch process, the edges of the access hole etch mask 612 over the lateral face of the etchable sublayer 608 prevents significant loss of material from the etchable sublayer 608. After the cavity etch process is completed, the access hole etch mask 612 is removed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming a microelectronic mechanical system (MEMS) device, comprising the steps of:
    forming an overlying dielectric layer stack over a substrate, said overlying dielectric layer stack having an etch-resistant lower portion and an etchable sublayer;
    forming an access hole in said overlying dielectric layer stack through at least said etchable sublayer such that a surface of said etchable sublayer is exposed;
    covering said exposed surface of said etchable sublayer; and
    after covering said exposed surface of said etchable sublayer, etching a cavity in said substrate through said access hole, such that said cavity underlaps said overlying dielectric layer stack by at least 5 microns; wherein:
    an input/output (I/O) pad is disposed in said overlying dielectric layer stack under said etchable sublayer;
    said step of forming said access hole exposes said I/O pad so as to form an I/O opening.

2. The process of claim 1, in which:
    said step of forming said access hole is performed in two steps;
    a first step of said two steps removes material from said overlying dielectric layer stack in an area for said access hole through said etchable sublayer but not down to said substrate; and
    a second step of said two steps is performed after a cavity etch mask is formed, so that said second step removes material from said overlying dielectric layer stack in said access hole down to said substrate.

3. The process of claim 2, in which an access hole etch mask is removed after said first step of forming said access hole and prior to forming said cavity etch mask.

4. The process of claim 1, in which said step of forming said access hole removes material from said overlying dielectric layer stack down to said substrate.

5. The process of claim 1, in which said step of covering said exposed surface of said etchable sublayer is performed by forming a cavity etch mask over said overlying dielectric layer stack.

6. The process of claim 5, in which said cavity etch mask includes photoresist and covers said exposed surfaces of said etchable sublayer with at least a micron of said photoresist.

7. The process of claim 1, in which said etch-resistant lower portion of said overlying dielectric layer stack includes silicon dioxide.

8. The process of claim 1, in which said etchable sublayer of said overlying dielectric layer stack includes silicon nitride.

9. The process of claim 1, in which said etchable sublayer of said overlying dielectric layer stack includes silicon oxynitride.

10. The process of claim 1, in which a diameter of said access hole is 10 to 25 microns.

11. The process of claim 1, wherein the step of covering the exposed surface of the etchable sublayer comprises the steps of:
    forming a conformal protective layer over said access hole etch mask and in said access holes, so as to cover exposed surfaces of said etchable sublayer;
    performing an anisotropic etchback process which removes material from said conformal protective layer at a bottom of said access hole and leaves material of said conformal protective layer on sidewalls of said access hole, so as to form protective sidewalls covering exposed surfaces of said etchable sublayer.

12. The process of claim 1, wherein the step of covering the exposed surface of the etchable sublayer comprises the steps of:
    performing an isotropic etchback of said etchable sublayer which removes material from said etchable sublayer so as to recess a lateral face of said etchable sublayer in said access hole back under an access hole etch mask at least one and one-half times a thickness of said etchable sublayer;
    performing a reflow operation on said access hole etch mask which causes edges of said access hole etch mask overhanging said etchable sublayer to drop down to a top surface of said etch-resistant lower portion so as to isolate said lateral face of said etchable sublayer in said access hole.

13. A process of forming a MEMS device, comprising the steps of:
    providing a substrate;
    forming an overlying dielectric layer stack over said substrate, said overlying dielectric layer stack including an etch-resistant lower portion and an etchable sublayer disposed over the etch-resistant lower portion, said etchable sublayer having an etch rate in a subsequent cavity etch process which is at least three times an etch rate of said etch-resistant lower portion in said cavity etch process;
    forming an access hole etch mask over said overlying dielectric layer stack, said access hole etch mask exposing said overlying dielectric layer stack in an area for at least one access hole;
    performing a first step of an access hole etch process which removes material from said overlying dielectric layer stack in said area for said access hole at least through said etchable sublayer, so as to form a first portion of said access hole;
    forming a conformal protective layer over said access hole etch mask and in said access holes, so as to cover exposed surfaces of said etchable sublayer;
    performing an anisotropic etchback process which removes material from said conformal protective layer at a bottom of said access hole and leaves material of said conformal protective layer on sidewalls of said access hole, so as to form protective sidewalls covering exposed surfaces of said etchable sublayer;
    performing a second step of said access hole etch which removes material from said overlying dielectric layer stack at said bottom of said access hole, down to said substrate, such that substantially no material is removed from said etchable sublayer during said second step of said access hole etch process; and
    performing a cavity etch process which removes material from said substrate through said access hole to form a cavity in the substrate, such that said cavity underlaps said overlying dielectric layer stack by at least 5 microns, and said etchable sublayer is protected by said protective sidewalls so that substantially no material is removed from said etchable sublayer.

14. The process of claim 13, in which said etch-resistant lower portion of said overlying dielectric layer stack includes silicon dioxide.

15. The process of claim 13, in which said etchable sublayer of said overlying dielectric layer stack includes a material selected from silicon nitride and silicon oxynitride.

16. A process of forming a MEMS device, comprising the steps of:
providing a substrate;
forming an overlying dielectric layer stack over said substrate, said overlying dielectric layer stack including an etch-resistant lower portion and an etchable sublayer disposed over the etch-resistant lower portion, said etchable sublayer having an etch rate in a subsequent cavity etch process which is at least three times an etch rate of said etch-resistant lower portion in said cavity etch process;
forming an access hole etch mask over said overlying dielectric layer stack, said access hole etch mask exposing said overlying dielectric layer stack in an area for at least one access hole;
performing a first step of an access hole etch process which removes material from said overlying dielectric layer stack in said area for said access hole at least through said etchable sublayer, so as to form a first portion of said access hole;
performing an isotropic etchback of said etchable sublayer which removes material from said etchable sublayer so as to recess a lateral face of said etchable sublayer in said access hole back under said access hole etch mask at least one and one-half times a thickness of said etchable sublayer;
performing a reflow operation on said access hole etch mask which causes edges of said access hole etch mask overhanging said etchable sublayer to drop down to a top surface of said etch-resistant lower portion so as to isolate said lateral face of said etchable sublayer in said access hole;
performing a second step of said access hole etch which removes material from said overlying dielectric layer stack at said bottom of said access hole, down to said substrate, such that substantially no material is removed from said etchable sublayer during said second step of said access hole etch process; and
performing a cavity etch process which removes material from said substrate through said access hole to form a cavity in the substrate, such that said cavity underlaps said overlying dielectric layer stack by at least 5 microns, and said etchable sublayer is protected by said edges of said access hole etch mask so that substantially no material is removed from said etchable sublayer.

17. The process of claim 16, in which said etch-resistant lower portion of said overlying dielectric layer stack includes silicon dioxide.

18. The process of claim 16, in which said etchable sublayer of said overlying dielectric layer stack includes silicon nitride.

19. The process of claim 16, in which said etchable sublayer of said overlying dielectric layer stack includes silicon oxynitride.

* * * * *